(12) United States Patent
Hochman et al.

(10) Patent No.: US 9,703,519 B2
(45) Date of Patent: *Jul. 11, 2017

(54) LED DISPLAY MODULES FOR LARGE-FORMAT LED DISPLAYS

(71) Applicant: Revolution Display, LLC, Glendale, CA (US)

(72) Inventors: Jeremy Hochman, Walnut, CA (US); Robbie Thielemans, Nazareth (BE)

(73) Assignee: Revolution Display, LLC, Glendale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/389,634

(22) Filed: Dec. 23, 2016

(65) Prior Publication Data

US 2017/0102911 A1    Apr. 13, 2017

Related U.S. Application Data

(63) Continuation of application No. 14/957,364, filed on Dec. 2, 2015, now Pat. No. 9,530,347, which is a
(Continued)

(51) Int. Cl.
*G09G 3/3225* (2016.01)
*G06F 3/14* (2006.01)
(Continued)

(52) U.S. Cl.
CPC ......... *G06F 3/1446* (2013.01); *G09G 3/3225* (2013.01); *H01L 27/3218* (2013.01); *H01L 51/56* (2013.01); *H01L 2227/323* (2013.01)

(58) Field of Classification Search
CPC .. G09G 3/3208; G09G 3/2003; G09G 3/3216; G09G 2300/026; H01L 27/3218; H01L 51/56
See application file for complete search history.

(56) References Cited

U.S. PATENT DOCUMENTS 6,870,519 B2    3/2005   Sundahl
7,629,945 B2   12/2009   Baudisch
(Continued)

FOREIGN PATENT DOCUMENTS

EP    1471493 A1    10/2004

OTHER PUBLICATIONS

Ng, "Design and Application of OLED Display Drivers," IIC-China / ESC-China 2004 Conference Proceedings, pp. 2-4 (2004).
(Continued)

*Primary Examiner* — Shaheda Abdin
(74) *Attorney, Agent, or Firm* — Downs Rachlin Martin PLLC

(57) ABSTRACT

LED display modules for large-format displays are disclosed. The LED display module includes a matrix of LEDs, with each LED having an anode and a cathode, and an LED drive circuit having electrical connections defined by rows and columns that electrically connect to the LEDs in the LED matrix. Groups of adjacent rows are arranged in parallel and groups of adjacent columns are arranged in parallel, thereby defining super pixels each having an array of four or more LEDs, wherein the LEDs in a given super pixel cannot be individually activated. The modules can be combined to form the large-format display.

24 Claims, 14 Drawing Sheets

Related U.S. Application Data continuation of application No. 14/558,792, filed on Dec. 3, 2014, now Pat. No. 9,524,666.

(51) Int. Cl.
*H01L 27/32* (2006.01)
*H01L 51/56* (2006.01)

(56) References Cited

U.S. PATENT DOCUMENTS

| | | | |
|---|---|---|---|
| 7,654,878 B2 | 2/2010 | Morley et al. | |
| 8,049,685 B2 | 11/2011 | Miller et al. | |
| 8,427,402 B2 | 4/2013 | Smith | |
| 8,743,027 B2 | 6/2014 | Wu et al. | |
| 9,524,666 B2 | 12/2016 | Hochman et al. | |
| 2002/0167458 A1 | 11/2002 | Baudisch et al. | |
| 2003/0184237 A1* | 10/2003 | Togashi | G09G 3/3216 315/169.3 |
| 2004/0174389 A1* | 9/2004 | Ben-David | G09G 3/3413 345/694 |
| 2004/0207315 A1 | 10/2004 | Robbie et al. | |
| 2004/0233125 A1 | 11/2004 | Tanghe et al. | |
| 2004/0233140 A1 | 11/2004 | Jo | |
| 2005/0017922 A1 | 1/2005 | Devos et al. | |
| 2008/0043043 A1* | 2/2008 | Thielen | G09G 5/00 345/667 |
| 2014/0204067 A1 | 7/2014 | Gupta | |
| 2016/0163773 A1 | 6/2016 | Hochman et al. | |

OTHER PUBLICATIONS

Shin et al., "Dynamic Voltage Scaling of OLED Displays," DAC'11, Jun. 5-10, 2011, San Diego, CA.

Fyfe, "Total Matrix Addressing for OLED Displays," Presentation at the 9th Annual Display Search US FPD Conference, Mar. 6-8, 2007, La Jolla, CA.

Svilainis, "Considerations of the Driving Electronics of LED Video Displays," Proc. of the ITI 2007 29th Int. Conf. on Information Technology Interfaces, Jun. 25-27, 2007, Cavtat, Croatia.

Hekmatshoar et al., "A Novel TFT-OLED Integration for OLED-Independent Pixel Programming in Amorphous-Si AMOLED Pixels," Journal of the SID, 16/1, 2008, pp. 183-188.

Fraunhofer Institute Photonische Mikrosysteme, "Multiline Passive Matrix OLED Driver ASIC," published at http://www.comedd.fraunhofer.de/content/dam/comedd/common/products/COMEDD/mla-e.pdf. (Last viewed Oct. 20, 2015).

European Search Report dated Apr. 12, 2016, in corresponding European Patent Application No. 15197314.6.

\* cited by examiner

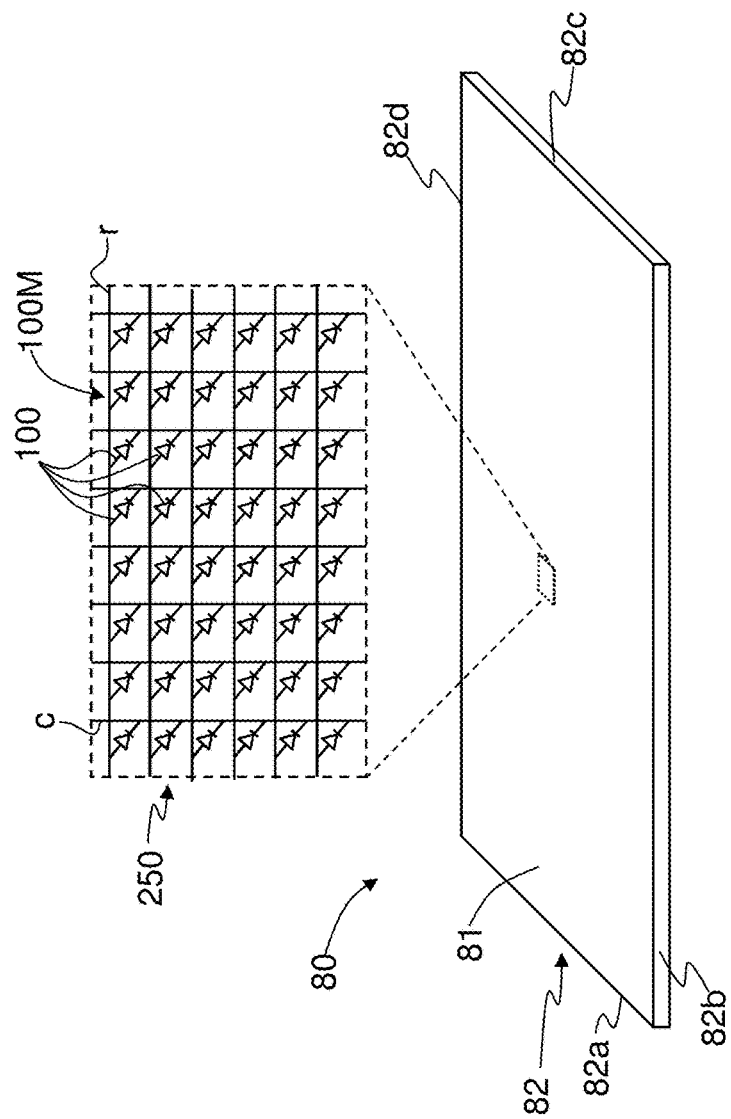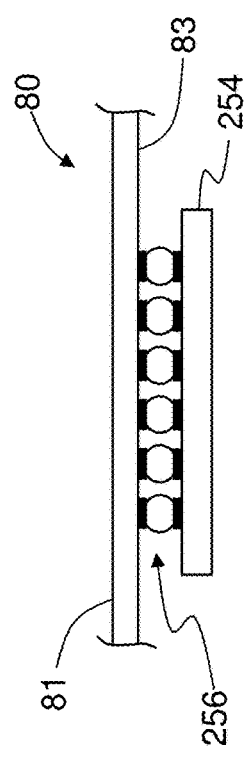

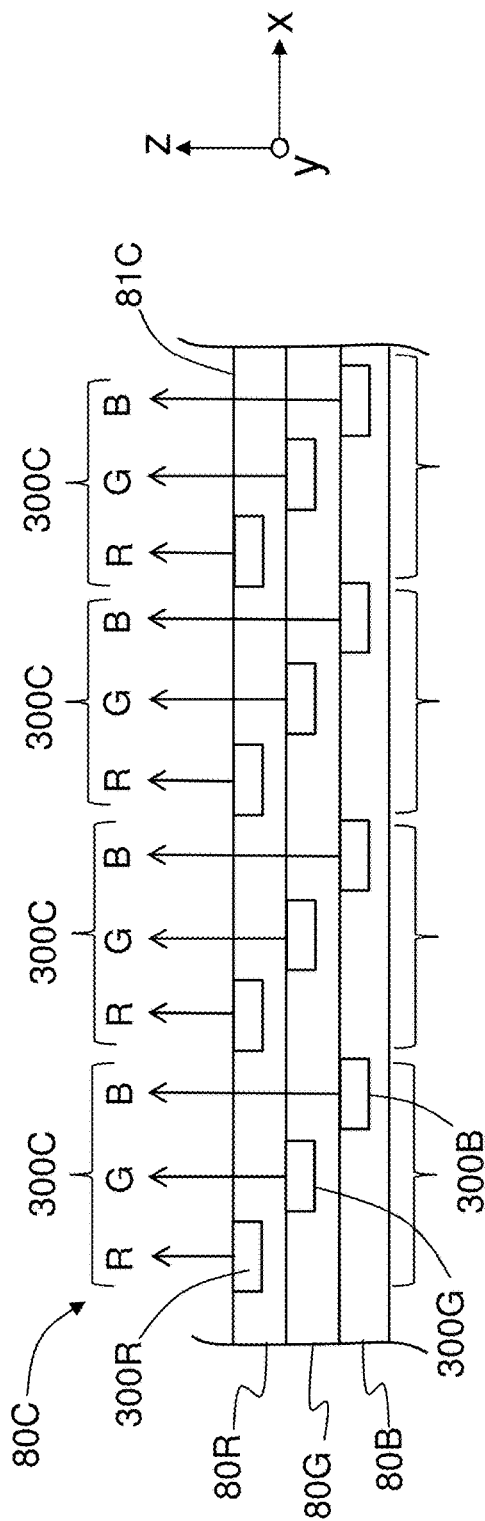
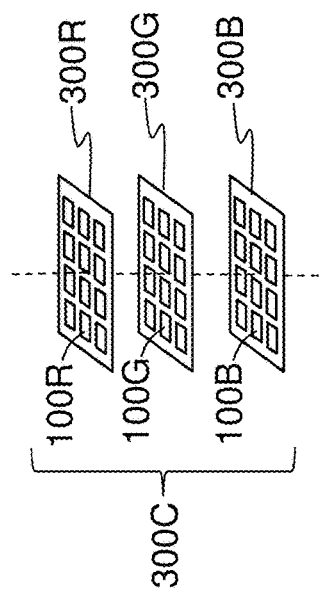
FIG. 6B
FIG. 6C

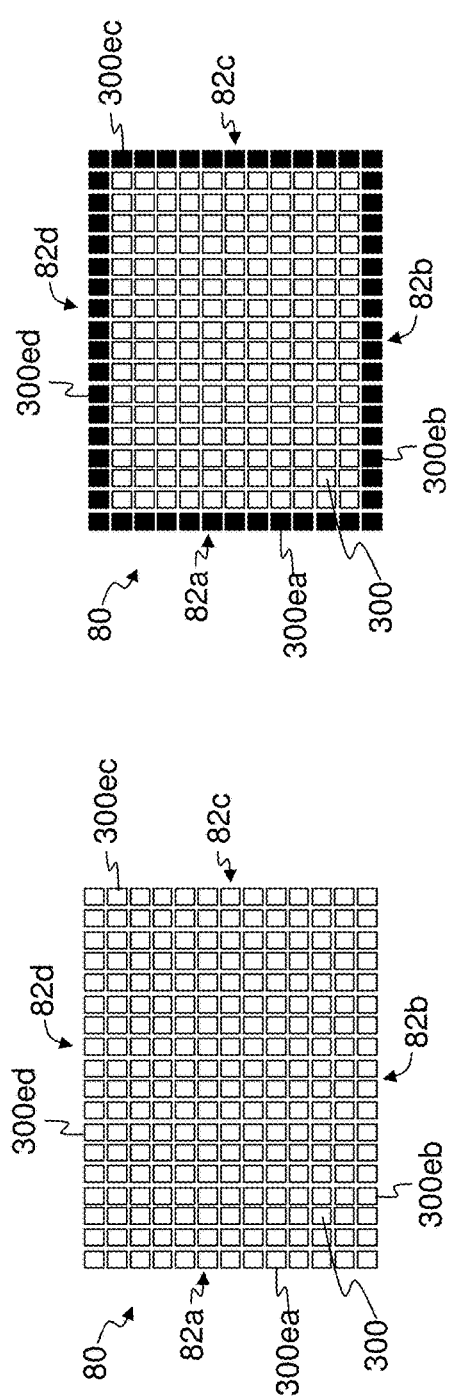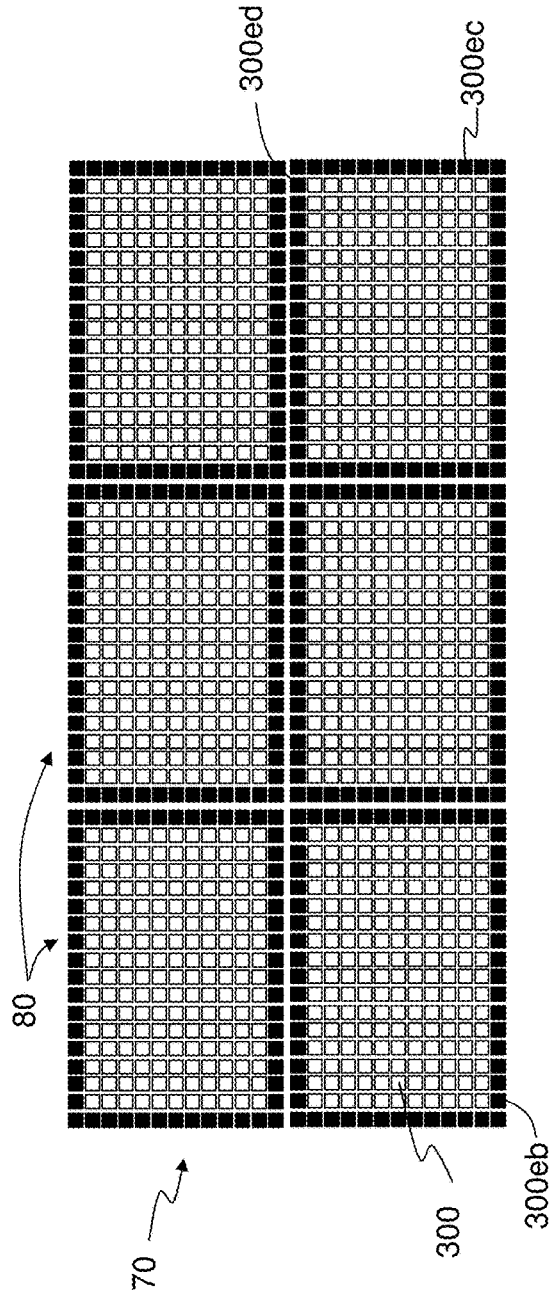

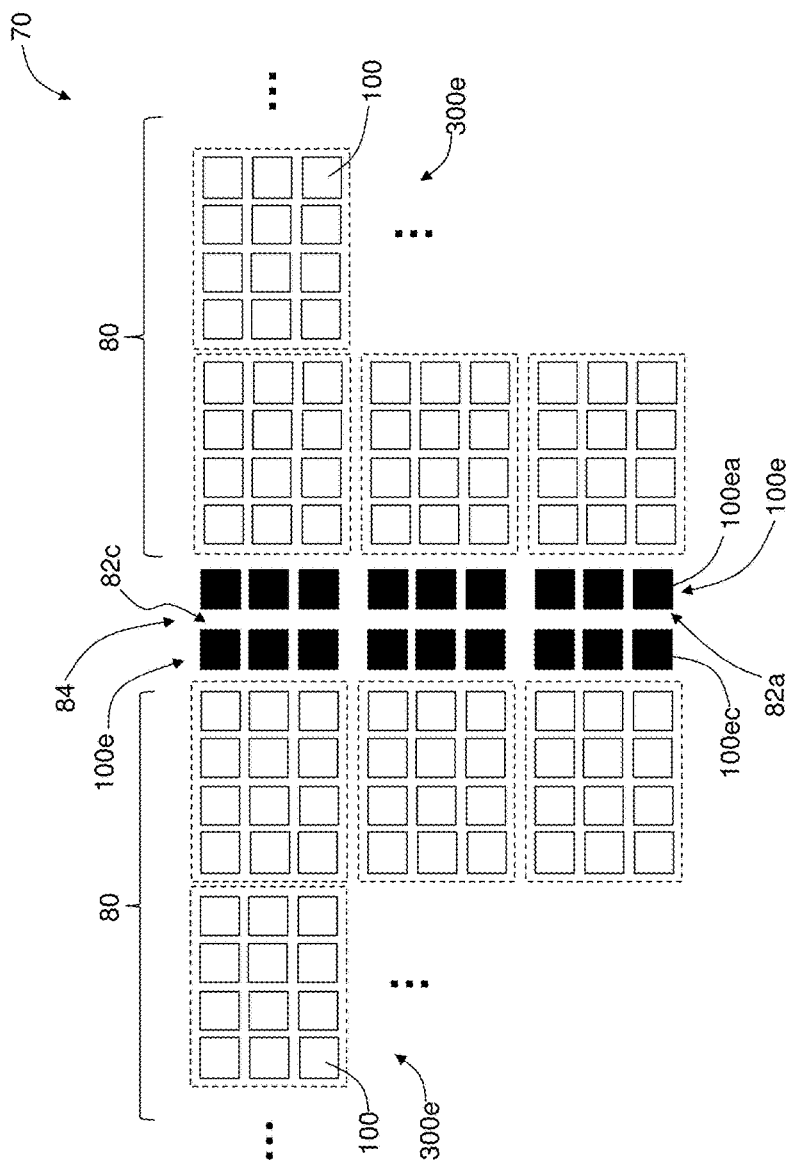

LED DISPLAY MODULES FOR LARGE-FORMAT LED DISPLAYS

RELATED APPLICATION DATA

This application is a continuation of U.S. patent application Ser. No. 14/957,364, filed Dec. 2, 2015, titled "OLED Display Modules For Large-Format OLED Displays," now allowed, which application is a continuation of U.S. patent application Ser. No. 14/558,792, entitled "OLED Display Modules For Large-Format OLED Displays" (now U.S. Pat. No. 9,524,666, issued Dec. 20, 2016). Each of these applications is incorporated by reference herein in its entirety.

FIELD OF THE INVENTION

The present invention generally relates to organic light-emitting diodes (OLEDs) and OLED displays, and in particular relates to OLED display modules for large-format OLED displays.

The entire disclosure of any publication or patent document mentioned herein is incorporated by reference, including US2004/0207315, entitled "Organic light-emitting diode display assembly for use in a large-screen display application," and US2005/0017922, entitled "Method for controlling an organic light-emitting diode display, and display applying this method."

BACKGROUND

Organic light-emitting diodes (OLEDs) utilize a layer of organic luminescent material that, when sandwiched between electrodes and subjected to a DC electric current, produces light of a variety of colors (wavelengths). These OLED structures can be combined into picture elements or "pixels" to form an OLED display. OLEDs are also useful in a variety of applications as discrete light-emitting devices or as the active element of light-emitting arrays or displays, such as flat-panel displays in watches, telephones, laptop computers, pagers, cellular phones, calculators, and the like. To date, the use of OLEDS to form light-emitting arrays or displays has been largely limited to small-screen applications such as those mentioned above.

Demands for large-format displays having higher quality and higher resolution have led the industry to turn to alternative display technologies to replace older LED and liquid crystal displays (LCDs). For example, LCDs fail to provide the bright, high light output, larger viewing angles, and high resolution and speed requirements that the large-format display market demands. Another drawback of conventional LCD's is the fact that the driving interconnections are made from the sides, which precludes efficient tiling of LCD-based display modules. By contrast, OLEDs promise bright, vivid colors in high resolution and at wider viewing angles and so are an appealing option as light sources for large-format displays, such as outdoor or indoor stadium displays, large marketing advertisement displays, and mass-public informational displays.

To date, the use of OLED technology in large-format displays has largely relied upon the same technology used for smaller OLED displays. While this approach is simple and generally sensible, it can also be relatively expensive and not always optimal for the given application.

SUMMARY OF THE DISCLOSURE

In one embodiment, the present disclosure is directed to an organic light-emitting diode (OLED) display module. The module includes a matrix of OLEDs, with each OLED having an anode and a cathode; an OLED drive circuit having electrical connections defined by rows and columns that electrically connect to the OLEDs in the OLED matrix; and wherein groups of i adjacent rows of electrical connections are arranged in parallel and wherein groups of j adjacent columns of electrical connections are arranged in parallel, thereby defining super pixels each having an i×j array of OLEDS, wherein i and j are integers equal to or greater than 2, and wherein the OLEDs in a given super pixel cannot be individually activated.

In another embodiment, the present disclosure is directed to a large-format OLED display. The OLED display includes a plurality of OLED display modules according to claim 1; and one or more panels, with each panel operably supporting one or more of the modules.

In yet another embodiment, the present disclosure is directed to a method of displaying a large-format display image. The method includes obtaining a matrix of organic light-emitting diodes (OLEDs), the matrix of OLEDs being electrically connected so as to define an OLED display having super pixels, wherein each super pixel includes a group of four or more OLEDs and wherein the OLEDs in each super pixel cannot be activated individually; providing a video signal representative of the display image to the OLED display; and displaying the display image on the OLED display using the super pixels.

In yet another embodiment, the present disclosure is directed to an organic light-emitting diode (OLED) display module. The module includes a matrix of OLEDs, with each OLED having an anode and a cathode, wherein some of the OLEDs constitute edge OLEDs; an OLED drive circuit having electrical connections defined by rows and columns that electrically connect to the OLEDs in the OLED matrix, wherein at least some of the edge OLEDs are not electrically connected to the OLED drive circuit; and wherein groups of adjacent rows of electrical connections are arranged in parallel and wherein groups of adjacent columns of electrical connections are arranged in parallel, thereby defining super pixels each having an array of at least four OLEDS, and wherein the OLEDs in a given super pixel cannot be individually activated.

In yet another embodiment, the present disclosure is directed to a method of manufacturing a display panel. The method includes obtaining a plurality of organic light-emitting diode (OLED) display modules each having a matrix of OLEDs, the matrix of OLEDs being electrically connected so as to define super pixels, wherein each super pixel includes a group of four or more OLEDs and wherein the OLEDs in each super pixel cannot be activated individually; arranging the plurality of OLED display modules as a display panel for providing a display image.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 2A is a schematic diagram of an example module and shows in the close-up inset a portion of the OLED drive circuit;

FIG. 2B is a cross-sectional view of the example module of FIG. 2A and illustrates an example that includes a circuit controller electrically connected to the row-and-column electrical connections using a ball-grid-array (BGA) structure;

FIG. 6B is a close-up cross-sectional view of a portion of the example color module of FIG. 6A;

FIG. 6C is an elevated, exploded view of an example color super pixel of the color module of FIGS. 6A and 6B;

FIGS. 7A through 7D illustrate example embodiments wherein at least some of the edge super pixels of a module are inactive or dark;

FIG. 9B is similar to FIG. 8A and shows a close-up view of portions of two adjacent modules, wherein the edge pixels of each module that reside adjacent the seam are inactive and are not part of any of the super pixels.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute a part of this Detailed Description.

Cartesian coordinates are shown in some of the Figures for the sake of reference and are not intended to be limiting as to direction or orientation.

In the discussion below, an A×B array of elements has A elements in the x-direction and B elements in the y-direction, wherein the x-direction represents the horizontal direction and the y-direction represents the vertical direction unless noted otherwise.

Also in the discussion below, a "module" is a display that in an example is configured such that it can be used to form a larger display by the combination of two or more modules, such as by operably supporting one or more modules using one or more panels. Examples of large-format displays that utilize display modules supported by panels are described in U.S. Pat. No. 7,654,878 and in U.S. Pat. No. 6,870,519.

In addition, in the discussion below, the term "sub-pixel" refers to an OLED that constitutes part of a super pixel. An edge sub-pixel is a sub-pixel that resides at the edge of the super pixel.

OLED Display System

Figure 1:
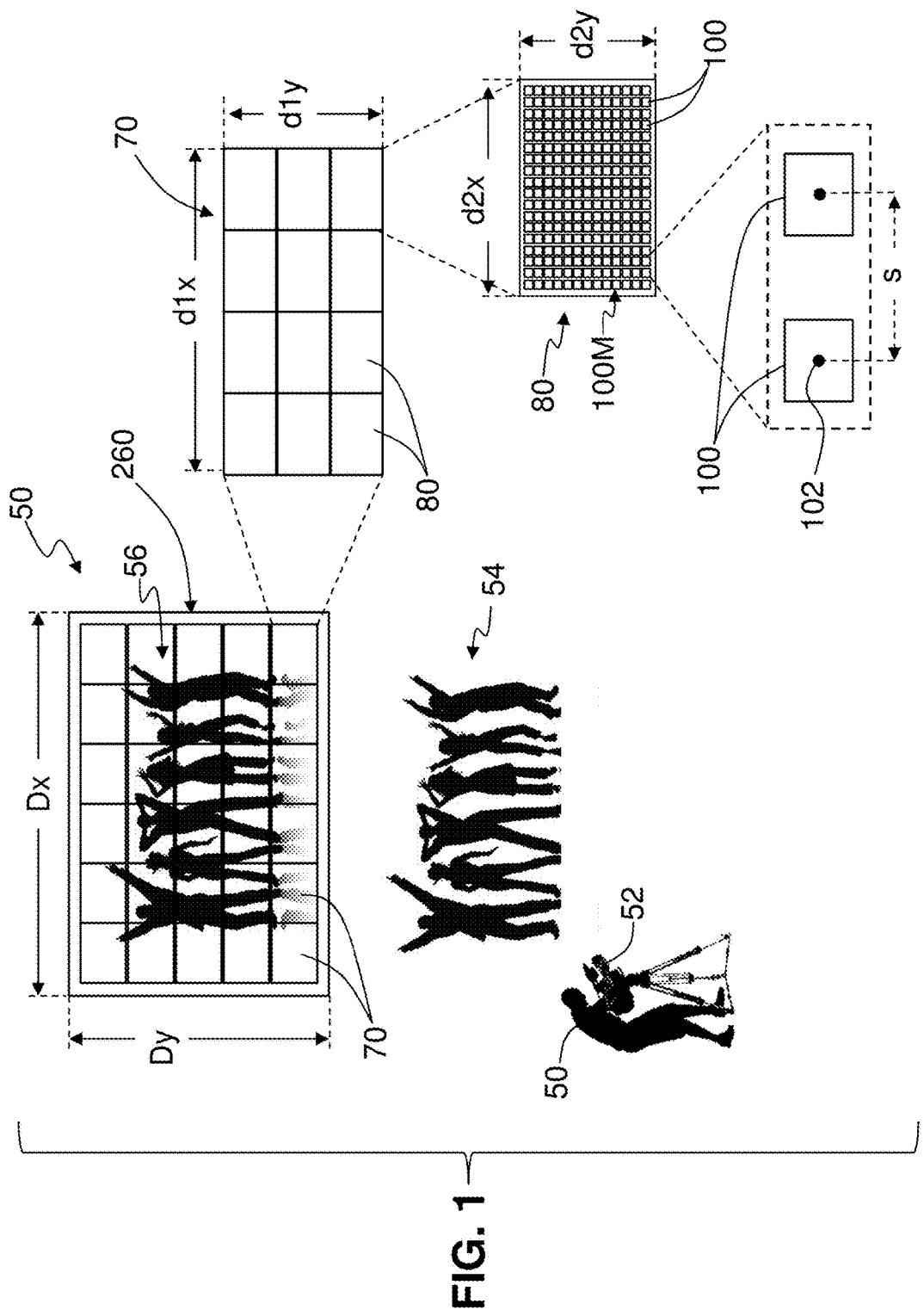
FIG. 1 shows an example large-format display system that includes a large-format OLED display that displays an image of people dancing as captured by a video camera, with the close-up insets showing increasingly higher resolution details of the large-format display screen, all the way down to the individual OLEDs.

FIG. 1 is a schematic diagram of an example OLED display system 50 that includes a large-format OLED-based display assembly ("OLED display") 260, which is described in greater detail below. The OLED display 260 has dimensions Dx and Dy. In an example, the dimension Dx can be many feet, e.g., greater than 2 feet or greater than 10 feet or even greater than 50 feet. The dimension Dy can have corresponding values consistent with the desired aspect ratio of OLED display 260. In the example shown, a cameraman 50 with a camera 52 records a video image of people 54 dancing, and the video image is relayed to OLED display 260 using conventional means to form an OLED display image 56.

In an example, OLED display 260 is made up of a number of display panels ("panels") 70, such as the 6×5 array of panels shown by way of example. Each display panel 70 has dimensions $d1x \times d1y$. In an example, the dimension $d1x$ can range from 450 to 500 mm and the dimension $d1y$ can range from 250 to 300 mm. In an example, each panel 70 can be made up of a number of display assemblies or "modules" 80, such as the 3×4 array of display modules shown. Each module 80 has dimensions $d2x \times d2y$. In an example, the dimension $d2x$ can range from 100 to 150 mm and the dimension $d2y$ can range from 80 to 120 mm.

FIG. 2A is a schematic diagram of an example module 80 that shows in the close-up inset a portion of an OLED drive circuit 250 as disclosed herein and as discussed in greater detail below. FIG. 2B is a cross-sectional view of the example module 80 of FIG. 2A. The module 80 has an upper surface 81, an edge 82, and a lower surface 83. In an example, module 80 is rectangular as shown and edge 82 is constituted by four edges 82a, 82b, 82c and 82d. The OLED drive circuit 250 includes a circuit controller 254 (e.g., a microcontroller) and a matrix 100M of OLEDs 100, each of which has a central light-emitting portion 102, as shown in the lowermost close-up inset in FIG. 1. Other electronic components known in the art, such as column registers, shift registers, etc. can be included in OLED drive circuit 250 but are not shown for ease of illustration. The OLED drive circuit 250 includes rows r and columns c that represent an x-y grid of electrical connections that electrically connect OLEDs 100 in OLED matrix 100M in a select manner as discussed below.

FIG. 2B shows an example wherein circuit controller 254 is electrically connected to row-and-column electrical connections r and c via lower surface 83 of module 80 using a ball-grid-array (BGA) structure 256.

In an example, OLEDs 100 have a center-to-center spacing s, which is typically in the range from just over 0.25 mm (e.g., 0.625 mm) to 3.5 mm. In an example, OLEDs 100 can emit light at one of a number of different wavelengths, such as red (R), green (G), blue (B), white (W), yellow (Y), orange (O), cyan (C), magenta (M) and other colors used in color displays. In some of the discussion below, OLEDs 100 are assumed to emit a single color of light so that OLED display 260 is monochromatic, for ease of illustration and discussion of the super-pixel configurations disclosed herein. Example embodiments of a color OLED display 260 that utilize the super-pixel configurations and OLED drive circuits 250 disclosed herein are also discussed below. In an example, OLED display 260 is configured to have high definition.

An advantage of using OLEDs 100 in module 80 is that they allow for electrical connections to be made from the back of the module (see FIG. 2B) rather than from the sides, as is done for liquid crystal display (LCD) panels. This means that the size of an optional bezel (not shown) on the upper surface 81 of module 80 can be reduced significantly as compared to that needed for an LCD panel because the bezel for the module would be used only for sealing OLEDs 100 from the surroundings and not for hiding electrical interconnects. This allows for modules 80 to be smaller than LCD panels while also reducing adverse effects of the bezels that arise between adjacent modules (e.g., so-called bezel or seam effects).

Conventional OLED Display

Figure 3:
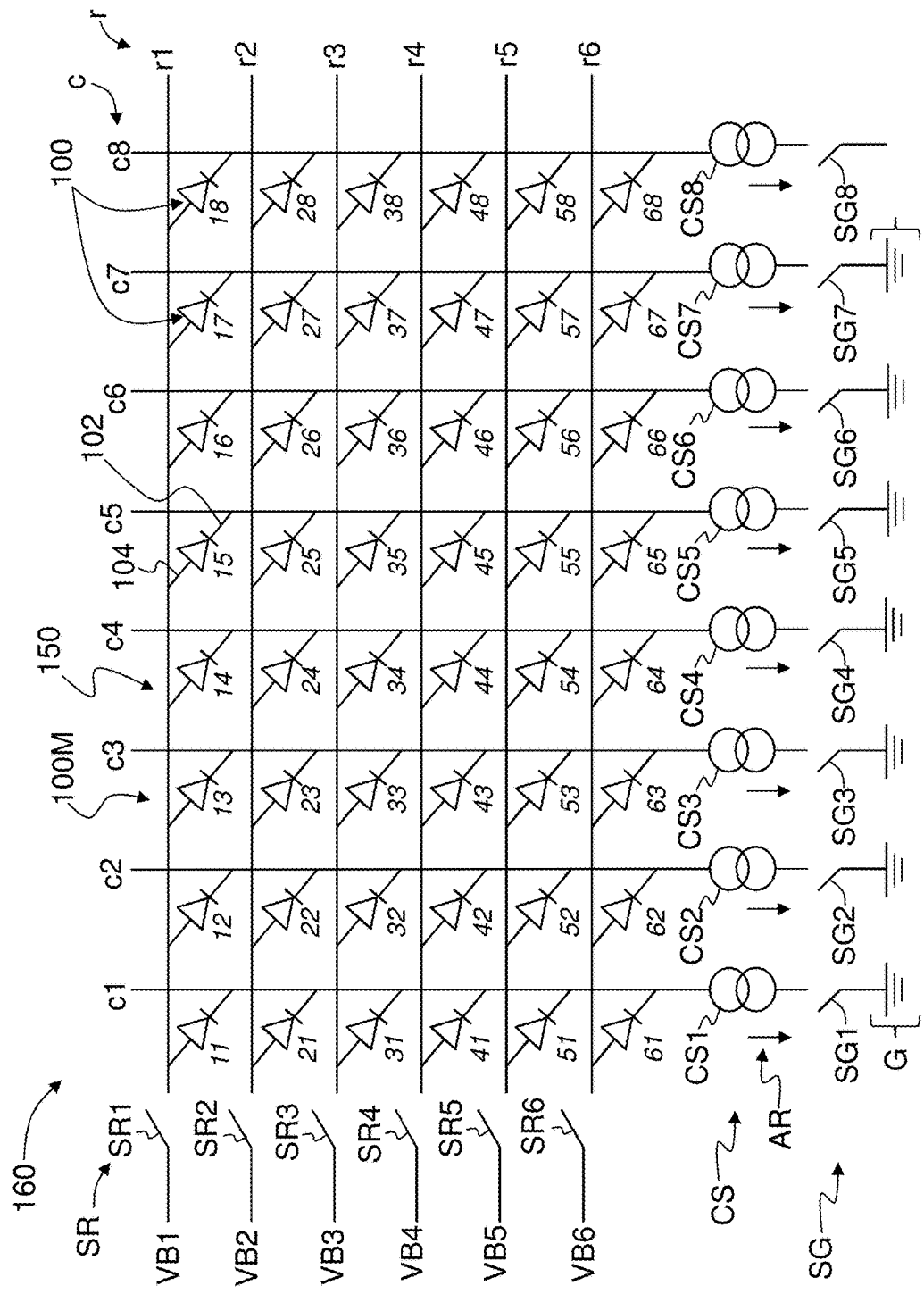
FIG. 3 is a schematic diagram of a conventional OLED display made up of an array of OLEDs electrically connected using a conventional common-anode OLED drive circuit wherein all the OLEDs are individually addressable and define pixels of the display.

FIG. 3 is a schematic circuit diagram of a conventional (prior art) OLED drive circuit 150 as part of a conventional OLED display 160. The OLED drive circuit 150 has a common-anode circuit configuration that allows for activating OLEDs 100 individually (i.e., the OLEDs are independently addressable). The OLED drive circuit 150 can also have a common cathode configuration, as is known in the art. In the example shown, OLED display 160 has eight columns and six rows of OLEDs 100 (i.e., is an 8×6 display), for a total of 48 OLEDs that define OLED matrix 100M. FIG. 3 includes numbers in italics that denote the matrix position (row and column) of OLEDS 100, e.g., 11 indicates the OLED in the first row, first column in the array, while 46 indicates the OLED in the fourth row, sixth column in OLED matrix 100M. Advantages of the common-anode configuration as compared to the common-cathode configuration include that for the former, the circuitry becomes more independent of the drive voltage. In the case of the common-cathode configuration, the drive voltage variations can have an effect on the current flowing through an OLED 100 and hence have an impact on the light output. In the common-anode configuration, the reference is ground G, which is by definition much more stable.

Commercially available displays can have many thousands of individual OLEDs 100, which are available in different formats, colors, sizes and other attributes. Each OLED 100 has a cathode 102 and an anode 104. The OLED drive circuit 150 includes an x-y grid of conductive lines or wires represented by columns c (e.g., c1 through c8) and rows r (e.g., r1 through r8). The cathode 102 and anode 104 of each OLED 100 is respectively electrically connected to a given row r and a given column c.

The OLED drive circuit 150 also includes current sinks CS (e.g., CS1 through CS8) arranged at an end of the respective columns c (e.g., columns C1 through C8), followed by ground switches SG (e.g., switches SG1 through SG8). Each row r includes a (row) switch SR (e.g., switches SR1 through SR6). The OLED drive circuit 150 also includes bank voltage inputs VB (e.g., VB1, VB2, ... VB6) for rows r. The bank voltage inputs VB reside adjacent switches SR.

Each OLED 100 emits light when a current passes from its anode 104 to its cathode 102. As an OLED 100 is a current-sensitive device, the current needs to be controlled to get the light output required without damaging the device. In an example, an OLED 100 and a current-limiting device such as a resistor (not shown) can be placed in a series circuit configuration. A voltage of higher potential is applied to the circuit closest to anode 104 and the other end of the series circuit is connected to a lower voltage potential. The difference in the voltage potential has to be high enough to overcome the threshold voltage of OLED 100. By adjusting either the resistance in series with OLED 100 or the voltage applied across the OLED and the resistor, the current can be set to generate the required light output for the given application.

For many designs, the lower voltage potential is set at ground level and the higher potential is a positive power supply. Instead of a simple resistor, current sinks CS are used, as shown in FIG. 3. The current sinks CS are well known to practitioners in the electrical arts and use an active circuit to control the current flowing through the branch. In this manner, the operation is less sensitive to changes in supply voltage or changes in OLEDs 100.

With continuing reference to FIG. 3 and as noted above, OLED drive circuit 150 is configured such that each OLED 100 in OLED matrix 100M can be activated individually. For example, to activate OLED 100 at position 11, a positive voltage is applied to voltage input VB1, a ground potential (i.e., ground G) is connected to current sink CS1, switch SR1 is turned on (i.e., is closed) and switch SG1 is also turned on. This causes current to flow from the positive voltage at VB1, through switch SR1, through OLED 100 at position 11, through current sink CS1, through switch SG1 and then to ground G, as indicated by the leftmost arrow AR.

Multiple OLEDs 100 in the same row r can be activated at the same time. While switch SR1 is active, any or all of the switches SG1 through SG8 can be activated. In this manner, the entire OLED display 160 can be activated one row r at a time by activating switches SR1 through SR6 one at a time while activating switches SG1 through SG8 such that OLEDs 100 are selectively illuminated. It is noted that multiple rows r cannot be activated at the same time since the current sinks CS1 through CS8 have been set to the current required by a single OLED 100. If two rows r of OLEDs 100 were activated, the current to those OLEDs in the activated columns c would be half of that required to activate OLEDs in a single row. This would reduce the amount of light emitted from OLEDs 100.

OLED Display With Super Pixels

Figure 4A:
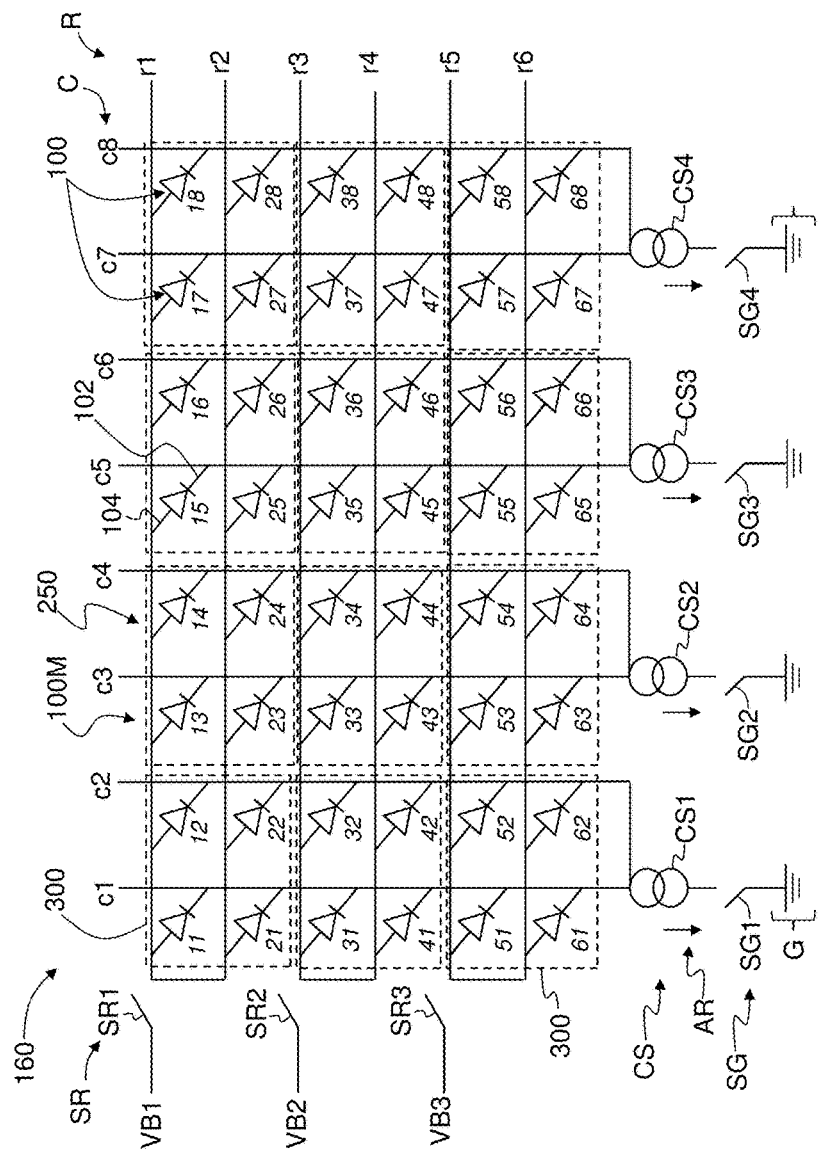
FIG. 4A is a schematic diagram of an example OLED display according to the disclosure that includes an array of OLEDs electrically connected in a common-anode drive-circuit configuration wherein select groups of 2×2 OLEDS are addressable, and wherein the select groups constitute super pixels for the display.

FIG. 4A is a schematic diagram of OLED drive circuit 250 as part of OLED display 260 as disclosed herein. The OLED drive circuit 250 has a modified common-anode circuit configuration. In another embodiment not shown, the OLED drive circuit 250 can have an analogous modified common-cathode configuration. The common-anode configuration has some advantages as described above and so is shown and discussed herein by way of illustration.

The OLED display 260 includes an 8×6 matrix 100M of OLEDs 100, with the dashed lines indicating groupings of adjacent OLEDs and with each grouping defining what is referred to herein a "super pixel" 300, wherein each OLED 100 in given super pixel constitutes a sub-pixel for that super pixel. The example OLED drive circuit 250 has a common-anode configuration but has half the number of switches SG and SR and half the number of current sinks CS.

The electrical connections or wires defined by rows r and columns c are arranged so that OLEDs 100 in each super pixel 300 can only be activated together, i.e., the OLEDs are no longer individually addressable. In the example OLED drive circuit 250 of FIG. 4A, rows r1 and r2 are electrically connected, rows r3 and r4 are electrically connected and rows r5 and r6 are electrically connected. Similarly, columns c1 and c2 are electrically connected, columns c3 and c4 are electrically connected, columns c5 and c6 are electrically connected, and columns c7 and c8 are electrically connected.

With this configuration for OLED drive circuit 250, OLEDs 100 at positions 11, 12, 21 and 22 are now connected in an electrically parallel fashion and are activated together rather than individually. These four OLEDs 100, which can be denoted as a set or group of OLEDs {11, 12, 21, 22}, now form a super pixel 300. Thus, the twelve super pixels 300 that define the 4×3 arrangement of the OLED display 260 of FIG. 3 are defined by the following sets or groups of OLEDs or sub-pixels: {11, 12, 21, 22}, {13, 14, 23, 24}, {15, 16, 25, 26}, {17, 18, 27, 28}, {31, 32, 41, 42}, {33, 34, 43, 44}, {35, 36, 45, 46}, {37, 38, 47, 48}, {51, 52, 61, 62}, {53, 54, 63, 64}, {55, 56, 65, 66} and {57, 58, 67, 68}.

The super pixels 300 of OLED display 260 of FIG. 4A are four times larger than the OLED pixels of the conventional OLED display 160 of FIG. 3. In an example, each OLED 100 (sub-pixel) in a given super pixel 300 can have substantially similar electrical and visual characteristics (e.g., a substantially similar emission wavelength) and share current when connected in a parallel fashion. In another example, OLEDs 100 in a given super pixel 300 can have at least one substantially different characteristic, such as different emission wavelengths.

With the super-pixel configuration for OLED matrix 100M of OLED display 260, the number of active electrical components in OLED drive circuit 250 is reduced as compared to the prior art OLED drive circuit 150 of FIG. 3. In the example shown in FIG. 4A, the OLED drive circuit 250 has gone from six switches SR for the positive supply to three, eight current sinks CS to four and eight ground switches SG to four. Overall, the number of active control elements has been reduced from twenty two to eleven. This reduction in active control elements scales with the size of OLED display 260.

Generally speaking, for a conventional OLED display 160 that includes p×q OLEDs 100 as pixels such as shown in FIG. 3, the "conventional" number $N_C$ of active electrical components is given by $N_C=2p+q$. Thus, for the example OLED display 150 of FIG. 3, p=8 and q=6, so that $N_C=2(8)+6=22$. For an OLED display 260 that includes m×n super pixels 300, the number $N_{SP}$ of active electrical components is $N_{SP}=2m+n$, which in the 4×3 example of FIG. 4A is $N_{SP}=2(4)+3=11$. The reduction or change Δ in the number of active electrical components is given by $\Delta=N_C-N_{SP}$, which is for the present example, Δ=11, which represents a 50% reduction in the number of active electrical components.

Because each activated super pixel 300 in the example OLED matrix 100M of FIG. 4A is four times as large as an individual OLED pixel, the capacity of the positive switches SR, current sinks CS and ground switches SG all need to handle four times the amount of current. However, the active control elements can be judiciously selected so that the scaling of the power capacity is not a substantial cost factor.

Figure 4B:
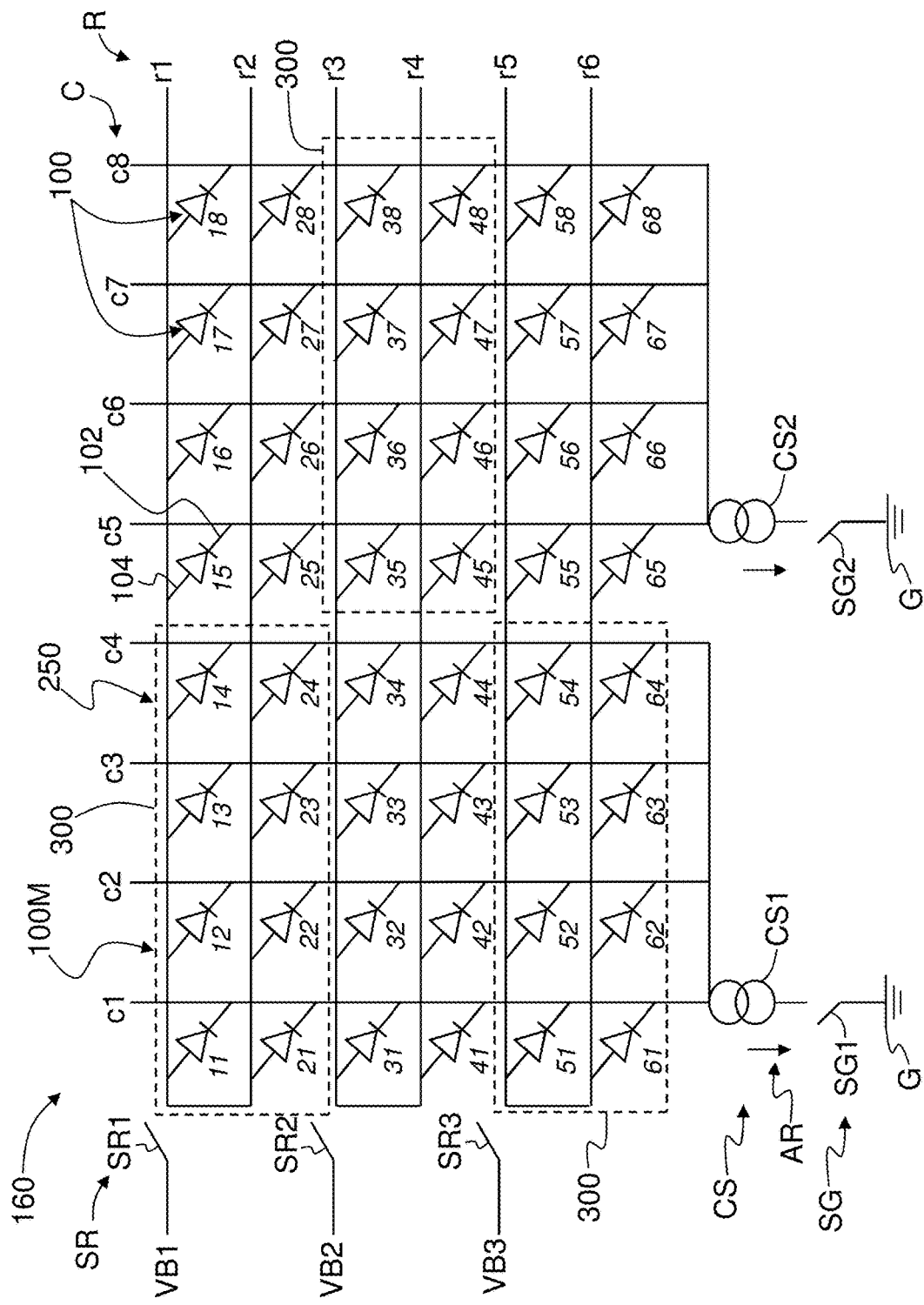
FIG. 4B is similar to FIG. 4A, but wherein the super pixels are constituted by select groups of 2×4 OLEDs.

FIG. 4B is similar to FIG. 4A and illustrates another example of OLED drive circuit 250 and OLED display 260, wherein super pixels 300 contain 8×2 OLEDs 100. In this case, rows r1 and r2 are electrically connected, rows r3 and r4 are electrically connected and rows r5 and r6 are electrically connected, while columns c1, c2 and c3 are electrically connected and columns c4, c5 and c6 are electrically connected. In this manner, the six super pixels 300 are defined by the following groups or sets of OLEDs 100 or sub-pixels: {11, 12, 13, 14, 21, 22, 23, 24}, {15, 16, 17, 18, 25, 26, 27, 28}, {31, 32, 33, 34, 41, 42, 43, 44}, {35, 36, 37, 38, 45, 46, 47, 48}, {51, 52, 53, 54, 61, 62, 63, 64}, {55, 56, 57, 58, 65, 66, 67, 68}. These sets of OLEDs 100 are now connected in an electrically parallel fashion and are activated together, thus defining six super pixels 300 having a 2×3 arrangement.

The number of active electrical components for the example of FIG. 4B is given by $N_{SP}=2n+m=2(2)+3=7$, so that the reduction in the number of active electrical components is Δ=22−7=15, or about a 68% reduction.

Because each super pixel 300 in the example of FIG. 4B is eight times as large as an individual sub-pixel defined by OLED 100, the capacity of the positive switches SR, current sinks CS and ground switches SG all have to handle eight (8) times the amount of current. As noted above in connection with FIG. 3, the active control elements can be judiciously selected so that the scaling of the power capacity is not a substantial cost factor.

In general, OLED drive circuit 250 as disclosed herein is configured to define super pixels 300 that consist of i×j OLEDs 100 by electrically connecting i adjacent columns and j adjacent rows for each super pixel. Any reasonable number of OLEDs 100 can be used to constitute a super pixel 300, and in an example the smallest super pixels can be 2×2. In an example, the size of super pixels 300 is selected based on OLED display 260 having high-definition resolution. An example high-resolution OLED display 260 can have for example 1280×720 super pixels 300 or 1920×1080 super pixels, as defined by OLED drive circuit 250 disclosed herein.

Figure 5:
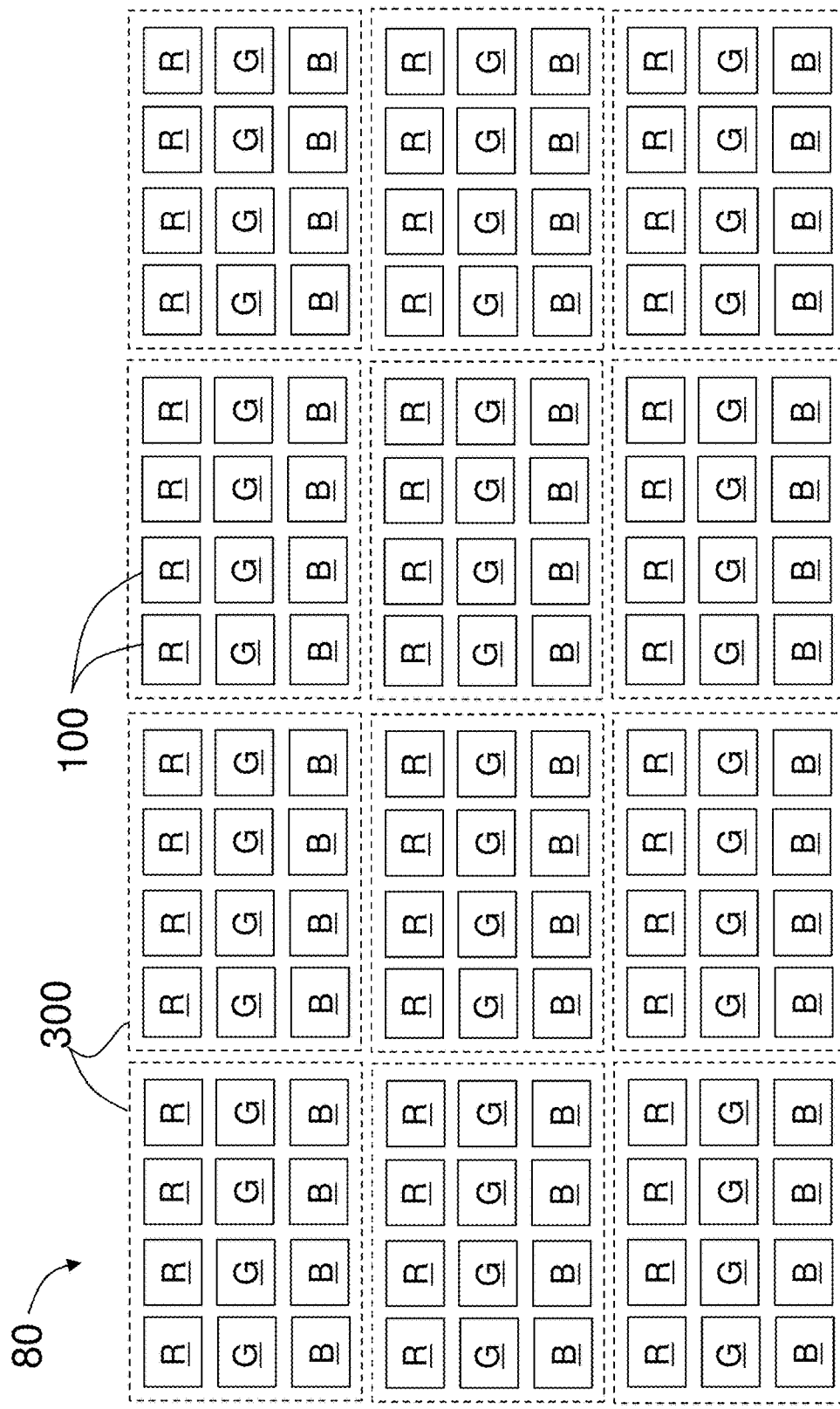
FIG. 5 is a front-on view of an example module of a display panel, wherein the module is made up of an array of 4×3 super pixels, each super pixel including red (R), green (G) and blue (B) OLEDs.

FIG. 5 is a close-up view of a portion of an example module 80 wherein each super pixel 300 includes red (R), green (G) and blue (B) OLEDs 100 so that the super pixels are color pixels and OLED display 260 is a color display. The super pixels 300 can other colors as well, such as those mentioned above Modules With Color Super Pixels FIG. 6A is an elevated exploded view of an example color module 80C that shows R, G and B monochrome modules 80R, 80G and 80B arranged in a layered configuration. The R, G and B monochrome modules 80R, 80G and 80B respectively include R, G and B OLEDs 100, denoted 100R, 100G and 100B, respectively. Other colors for the monochrome modules 80 can be used (e.g., white W, yellow Y, orange O, cyan C and magenta M) and the R, G and B colors are selected here merely for the sake of illustration and because R, G and B are common display colors.

The R, G and B monochrome OLED displays 260R, 260G and 260B include respective super pixels 300R, 300G and 300B, which are respectively made up of OLEDs 100R, 100G and 100B. In the example shown in FIG. 6A, super pixels 300R, 300G and 300B are each 4×3, as illustrated in the close-up insets.

It can be noted that R, G and B super pixels 300R, 300G and 300B need not be activated at the same time. In an example, one of the super pixels 300, such as the red super pixels 300R, can be driven all in parallel, while the other super pixels, such as the G and B super pixels 300G and 300B, can be driven individually. In one example, the R, G and B super pixels 300R, 300G and 300B are activated at the same time, i.e., are driven simultaneously.

Figure 6A:
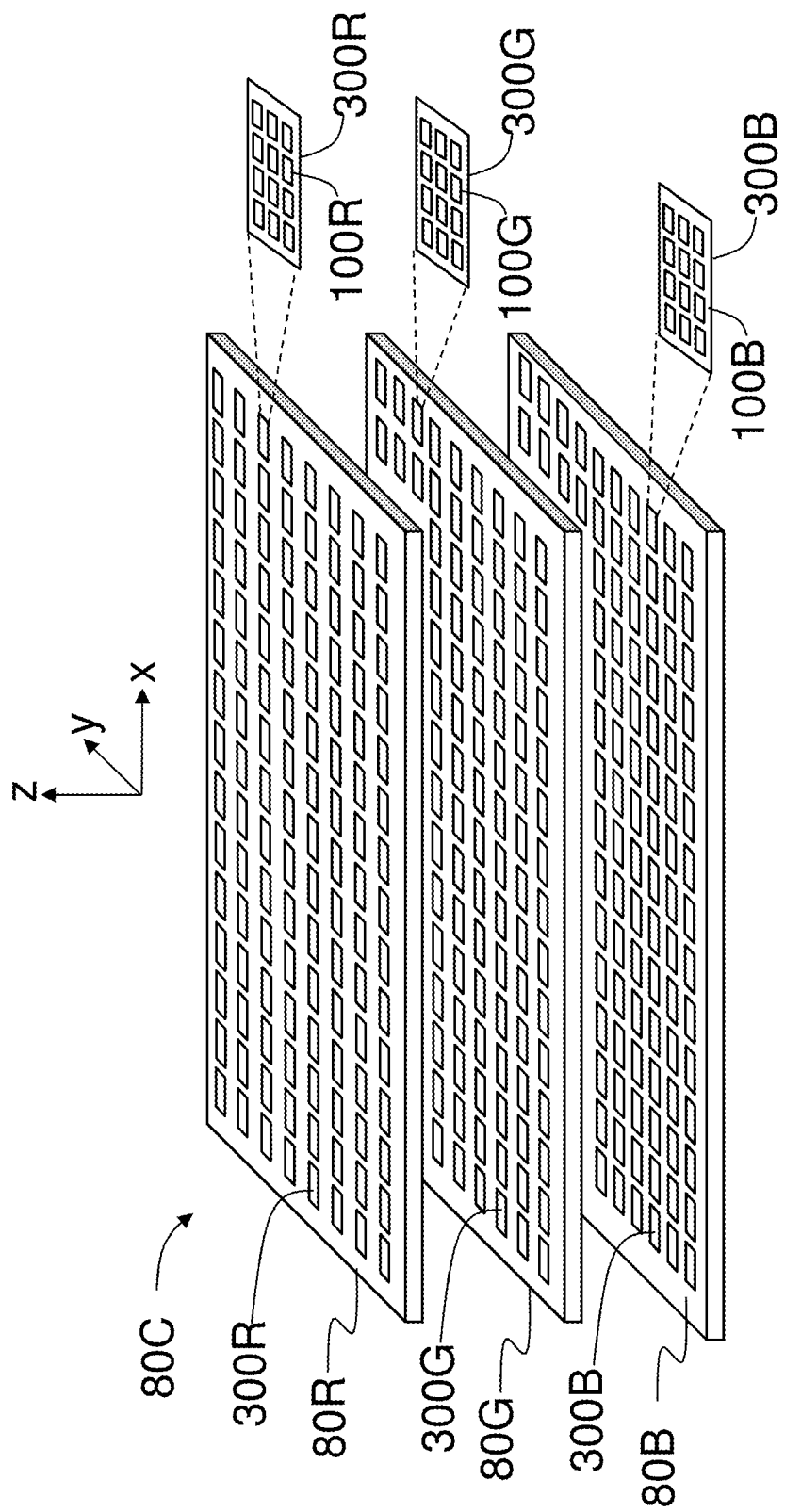
FIG. 6A is an elevated exploded view of an example color OLED module that shows R, G and B monochrome modules arranged in a layered configuration.

FIG. 6B is a close-up cross-sectional view of a portion of the example color module 80C of FIG. 6A. The layered configuration is made possible by the fact that the individual monochrome modules 80R, 80G and 80B are substantially transparent. The OLED displays 260 are formed using a screened electronics process wherein the individual OLEDS can have nearly identical light output characteristics given the same electrical stimulus. The OLED displays 260 are commercially available in different resolutions, colors, and sizes and with other features, depending on the needs of the final application.

The monochrome red, green and blue modules 80R, 80G and 80B are configured so that the respective super pixels 300R, 300G and 300B emit R, G and B light generally in the z-direction through an upper surface 81C of color module 80C. In an example, super pixels 300R, 300G and 300B are offset in the x-y plane as shown. In an example, triplets of super pixels 300R, 300G and 300B define color super pixels 300C. FIG. 6C is an elevated, exploded view of an example color super pixel 300C of color module 80C.

OLED Display With Dark Super Pixels Or Dark OLEDs

Figure 7D:
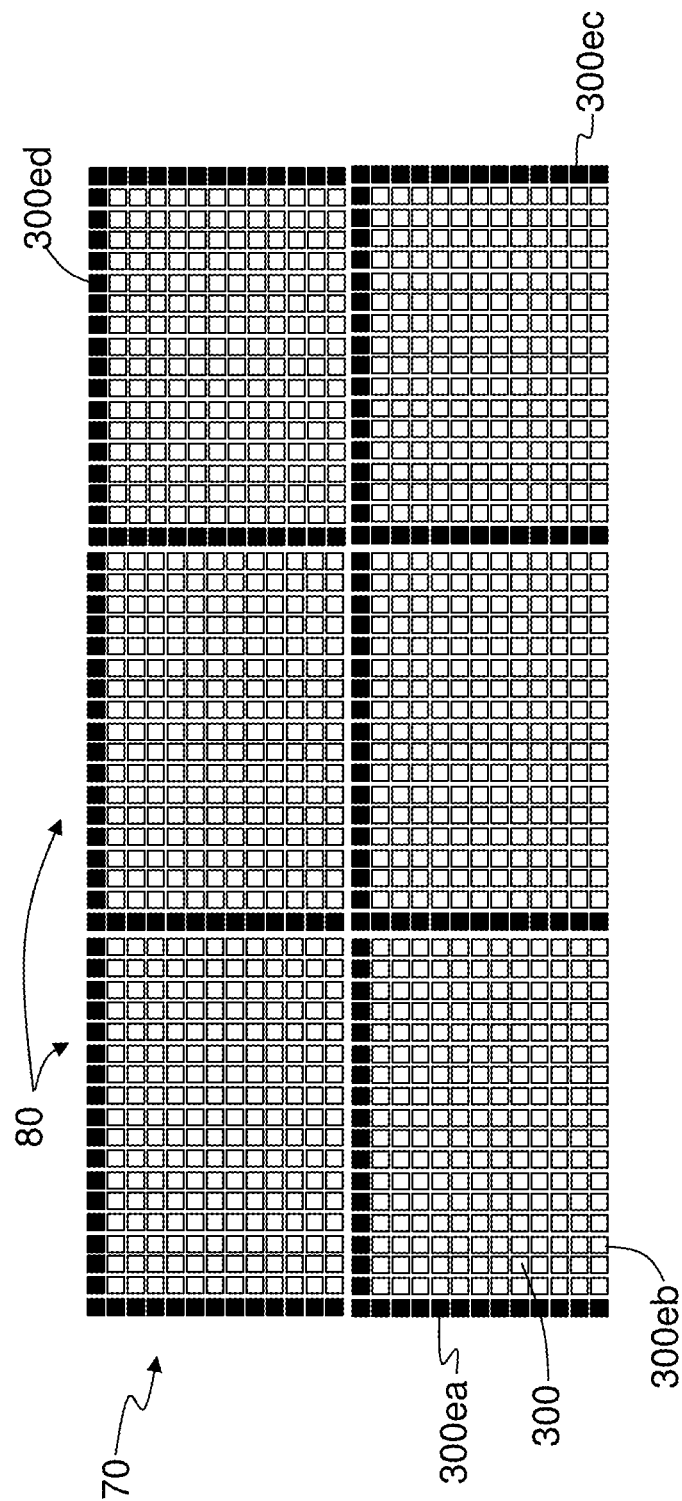

FIG. 7A is a front-on view of an example module 80 made up of 234 super pixels 300 in an 18×13 configuration. The module 80 includes outer edges 82a, 82b, 82c and 82d at which reside edge super pixels 300e, respectively denoted 300ea, 300eb, 300ec and 300ed. FIG. 7B is similar to FIG. 7A and shows edge super pixels 300e as inactive or dark super pixels. FIG. 7C shows an example panel 70 made up of modules 80 of FIG. 7B having dark edge pixels 300ea, 300eb, 300ec and 300ed. FIG. 7D is similar to FIG. 7C and shows an example where for adjacent modules 80, only one row and/or column of edge super pixels 300e are dark super pixels.

Figure 8A:
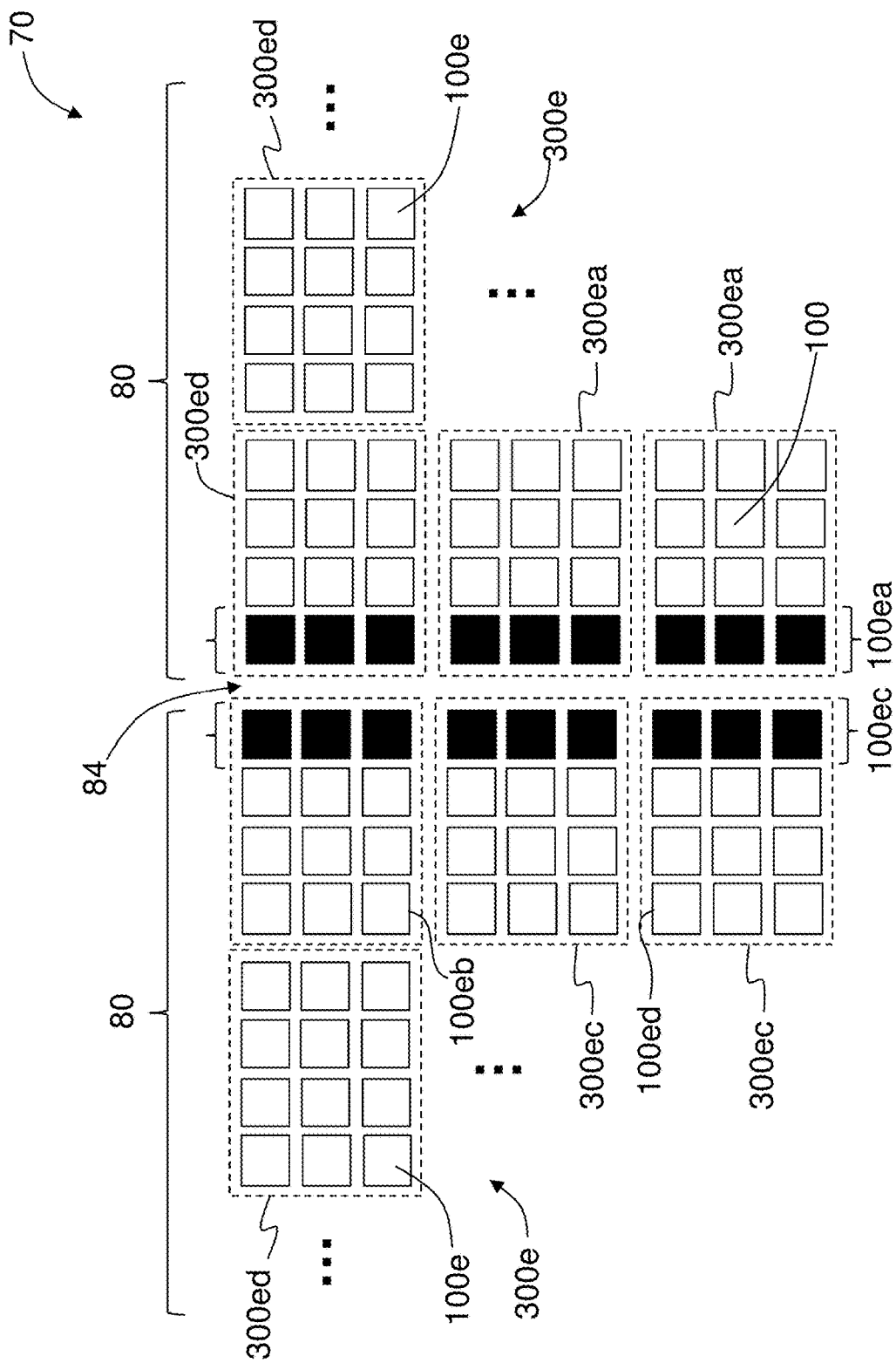
FIG. 8A is a close-up view of portions of two adjacent modules illustrating dark edge super pixels that reside adjacent the seam formed by the two adjacent modules, wherein the edge OLEDs in the edge super pixels are dark.

FIG. 8A is a close-up, front-on view of an example panel 70 that shows two adjacent modules 80 and a seam 84 that resides between the modules. The modules 80 each include super pixels 300 in a 4×3 configuration. In FIG. 8A, only edge super pixels 300e are shown for ease of illustration. In the example panel 70, for the edge super pixels 300ec and 300ea hat define seam 84, the most edgewise OLEDs 100 in the edge super pixels are inactive or dark super pixels. Thus, rather than having all of OLEDs 100 of edge super pixel 300e being dark (so that the entire edge super pixel is dark), only the edge OLEDs, denoted 100ec and 100ea, are dark or inactive. Note that this same technique can be used for seams 84 that are horizontal, with the corresponding edge OLEDs 100ed and 100eb being inactive.

Figure 8B:
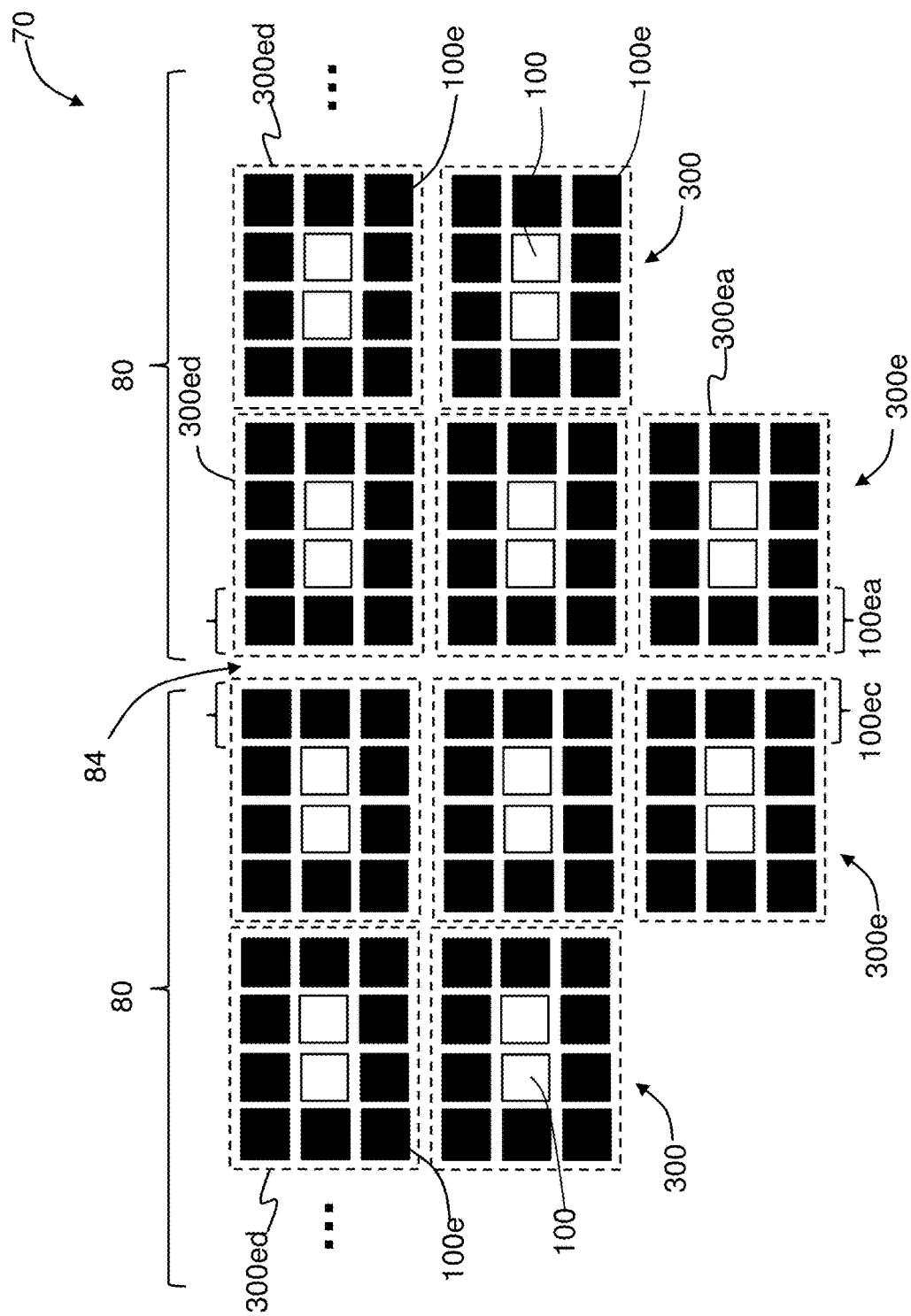
FIG. 8B is similar to FIG. 8A and illustrates an example wherein all of the edge OLEDs (i.e., edge sub-pixels) in each super pixel in the module are dark.

FIG. 8B is similar to FIG. 8A and illustrates an example wherein all of the edge OLEDs 100e of each edge super pixel 300e are dark. In an example, some or all of the super pixels 300 in each module 80 and not just the edge super pixels 300e have all of their edge OLEDs 100e being dark. Two non-edge super pixels 300 are shown in FIG. 8B by way of illustration. In general, a large number of configurations are available for each module 80 wherein one or more of the super pixels 300 have some or all of their edge OLEDs 100e as being dark The inactive or dark edge OLEDs 100e can be formed by not connecting the OLEDs to a row r or column c in OLED drive circuit 250. In another example, the inactive or dark edge OLEDs 100e can be formed by having them electrically connected with the rows r and columns c but programming circuit controller 254 to recognize the edge OLEDs and to provide a bank voltage VB suitable for preventing select edge OLEDs from emitting light (e.g., holding the bank voltage VB high to prevent current flow through the edge OLED). In a similar manner, entire edge super pixels 300e of a given module 80 can be made dark by programming circuit controller 254 to selectively activate only those super pixels 300 that do not reside next to super pixels of an adjacent module. In the case of FIG. 7D, circuit controller 254 can be programmed to ensure that only one column c or row r of edge super pixels 300e that reside adjacent seam 84 are inactive.

Figure 9A:
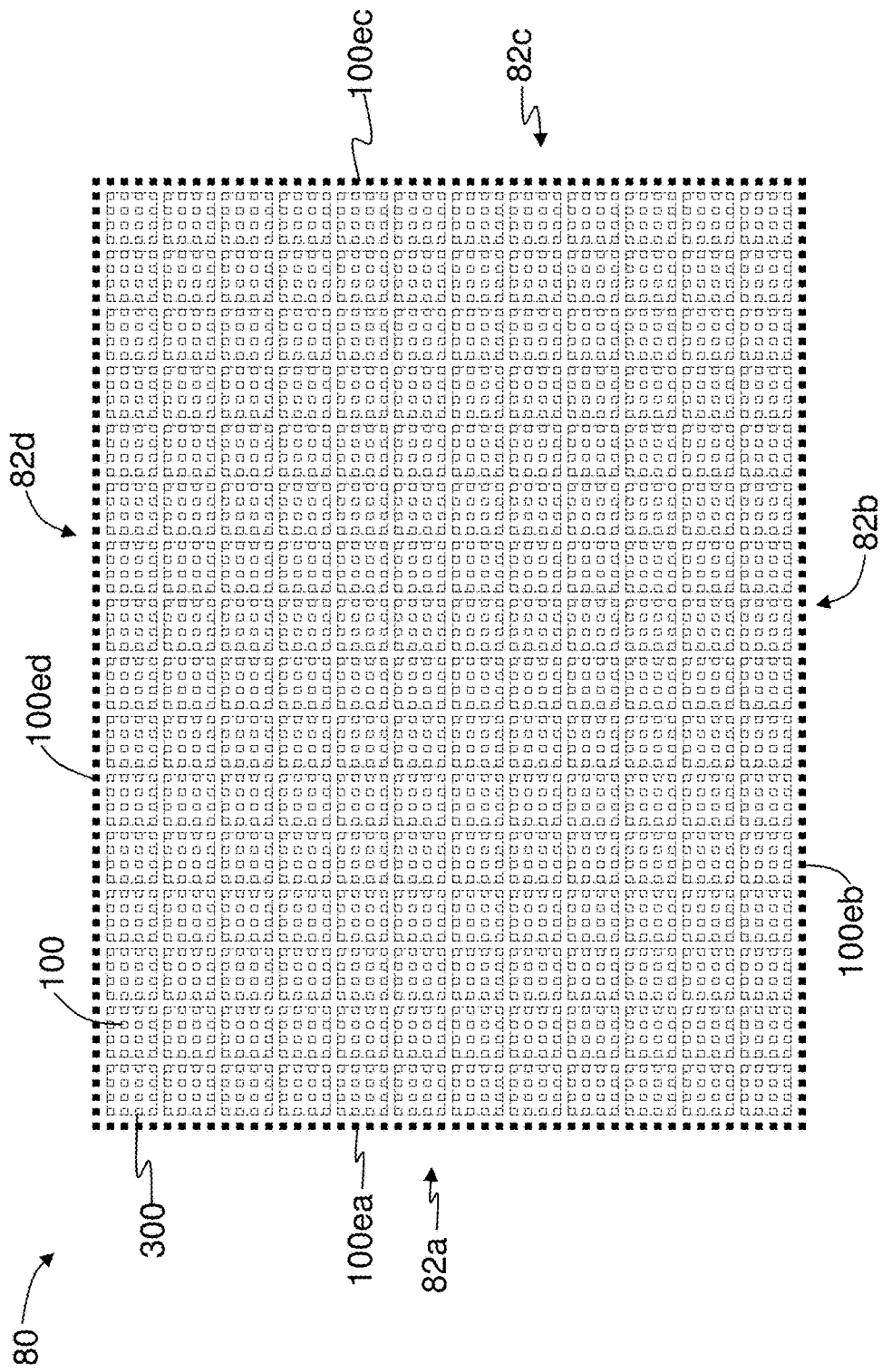
FIG. 9A is a front-on schematic diagram of an example module having a 64×48 OLED matrix of OLEDs, with the OLEDS arranged in 4×4 super pixels, so that the module has 16×12 super pixels.

FIG. 9A is a front-on schematic diagram of an example module 80 having a 64×48 OLED matrix 100M of OLEDs 100, with 4×4 super pixels 300, so that the module has 16×12 super pixels. The module 80 includes edge OLEDs 100e or edge sub-pixels (i.e., 100ea, 100eb, 100ec and 100ed) that are inactive or dark and that do not belong to any of super pixels 300. An example module 80 has at least one of edge OLEDs 100ea, 100eb, 100ec and 100ed as dark or inactive edge OLEDs (i.e., the module has one or more dark edges 82a, 82b, 82c and 82d).

FIG. 9B is a close-up view of portions of two adjacent modules 80 wherein edge OLEDS 100ec of the left-side module and edge OLEDs 100ea of the right-side module are inactive or dark, and wherein both of these edge OLEDs do not belong to any of super pixels 300. In an example, the dark edge OLEDs 100e are dark or inactive by virtue of not being electrically connected to OLED drive circuit 250.

One reason for having dark edge pixels 300e is to improve the overall resolution of OLED display 260. Typically, modules 80 that make up OLED display 260 are formed on a glass substrate. In some examples, the thickness of the glass substrate creates illumination issues at seams 84 between adjacent modules 80 that give rise to undesirable visual effects when a display image is viewed. Consequently, it can be advantageous to have no light emission from either edge super pixels 300e or edge OLEDs 100e at seam 84 or the interface between adjacent modules 80.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A light-emitting diode (LED) display module, comprising:
    a matrix of LEDs, with each LED having an anode and a cathode; and
    an LED drive circuit having electrical connections defined by rows and columns that electrically connect to the LEDs in the LED matrix,
    wherein groups of i adjacent rows are arranged in parallel and wherein groups of j adjacent columns are arranged in parallel, thereby defining super pixels each having an i×j array of LEDs, wherein i and j are integers equal to or greater than 2, and wherein the LEDs in a given super pixel cannot be individually activated, and
    wherein some of the super pixels are edge super pixels, and wherein the display module does not emit light visible to an observer from regions where at least some of the edge super pixels are located.

2. The LED display module according to claim 1, wherein the LED display module includes n rows and k columns of super pixels, wherein n and k are integers, further wherein the LED drive circuit has a common-anode configuration, including only k current sinks and only k column switches, with each super pixel column including one of the current sinks and one of the column switches, and the LED drive circuit including only n voltage inputs and only n row switches with each super pixel row including one of the voltage inputs and one of the row switches.

3. The LED display module according to claim 1, wherein the LEDs in the matrix of LEDs emit light of substantially the same wavelength.

4. The LED display module according to claim 1, wherein LEDs within one of the super pixels emit a different color of light than other LEDs within the same super pixel.

5. The LED display module according to claim 4, wherein at least one LED within the super pixel emits red light, at least one LED within the super pixel emits green light and at least one LED within the super pixel emits blue light.

6. The LED display module according to claim 4, wherein the colors of light emitted by LEDs within the super pixel include two or more of red, green, blue, yellow, white, orange, magenta or cyan.

7. The LED display module according to claim 1, wherein some of the super pixels are edge super pixels, and wherein at least some of the edge super pixels are inactive.

8. The LED display module according claim 1, wherein some of the super pixels have edge sub-pixels, and wherein one or more of the edge sub-pixels are inactive.

9. The LED display module according claim 8, wherein each of the edge sub-pixels in each super pixel is inactive.

10. The LED display module according to claim 1, further including a circuit controller electrically connected to the rows and columns.

11. The LED display module according to claim 10, wherein the circuit controller is electrically connected to the rows and columns via a ball-grid-array (BGA) structure.

12. The LED display module according to claim 1, wherein the LED display module includes a plurality of monochrome modules arranged in a layered configuration, at least one of the monochrome modules configured to emit a different color of light than another one of the monochrome modules, further wherein each of the monochrome modules includes at least one of the matrix of LEDs defining super pixels, wherein the LEDs in at least one super pixel in at least one monochrome module cannot be individually activated.

13. A light-emitting diode (LED) display module, comprising:
a matrix of LEDs, with each LED having an anode and a cathode, wherein some of the LEDs constitute edge LEDs;
a LED drive circuit having electrical connections defined by rows and columns that electrically connect to the LEDs in the LED matrix wherein at least some of the edge LEDs are not electrically connected to the LED drive circuit,
wherein groups of adjacent rows are arranged in parallel and wherein groups of adjacent columns are arranged in parallel, thereby defining super pixels each having an array of at least four LEDs, and wherein the LEDs in a given super pixel cannot be individually activated, and
wherein the LED display module includes n rows and k columns of super pixels, wherein n and k are integers, further wherein the LED drive circuit includes only n row switches and only k column switches, each super pixel row including one of the row switches and each super pixel column including one of the column switches.

14. The LED display module according to claim 13, further wherein the LED drive circuit has a common-anode configuration, including only k current sinks, and only n voltage inputs, each super pixel column including one of the current sinks and one of the column switches and each super pixel row including one of the voltage inputs and one of the row switches.

15. The LED display module according to claim 13, wherein the LED drive circuit has a common-cathode configuration.

16. The LED display module according to claim 13, wherein all of the edge LEDs are not electrically connected to the LED drive circuit and are not included in any of the super pixels.

17. The LED display module according to claim 13, wherein the module includes four edges, and wherein all of the edge LEDs that reside along at least one of the four edges of the module are not electrically connected to the LED drive circuit.

18. The LED display module according to claim 13, wherein LEDs within one of the super pixels emits a different color of light than other LEDs within the super pixel.

19. The LED display module according to claim 18, wherein colors of light emitted by LEDs within the super pixel include two or more of red, green, blue, yellow, white, orange, magenta and cyan.

20. The LED display module according to claim 13, wherein each super pixel includes edge sub pixels, and wherein at least some of the edge sub pixels in each super pixel are inactive.

21. The LED display module according to claim 20, wherein all of the edge sub pixels in each super pixel are inactive.

22. The LED display module according to claim 13, wherein the module is a color module including a plurality of monochrome modules arranged in a layered configuration, at least one of the monochrome modules configured to emit a different color of light than another one of the monochrome modules, wherein each of the monochrome modules includes one of the matrix of LEDs defining super pixels, wherein the LEDs in a given super pixel in a given monochrome module cannot be individually activated.

23. A light-emitting diode (LED) display module, comprising:
a matrix of LEDs, with each LED having an anode and a cathode; and
an LED drive circuit having electrical connections defined by rows and columns that electrically connect to the LEDs in the LED matrix,
wherein groups of i adjacent rows are arranged in parallel and wherein groups of j adjacent columns are arranged in parallel, thereby defining super pixels each having an i×j array of LEDS, wherein i and j are integers equal to or greater than 2, and wherein the LEDs in a given super pixel cannot be individually activated, and
wherein some of the super pixels have edge sub-pixels, and wherein the display module does not emit light visible to an observer from regions where one or more of the edge sub-pixels are located.

24. A light-emitting diode (LED) display module, comprising:
a matrix of LEDs, with each LED having an anode and a cathode; and
an LED drive circuit having electrical connections defined by rows and columns that electrically connect to the LEDs in the LED matrix,
wherein groups of i adjacent rows are arranged in parallel and wherein groups of j adjacent columns are arranged in parallel, thereby defining super pixels each having an i×j array of LEDS, wherein i and j are integers equal to or greater than 2, and wherein the LEDs in a given super pixel cannot be individually activated, wherein some of the super pixels are edge super pixels, and wherein the display module does not emit light visible to an observer from regions where at least some of the edge super pixels are located, and wherein the LED display module includes n rows and k columns of super pixels, wherein n and k are integers, further wherein the LED drive circuit includes only n row switches and only k column switches, each super pixel row including one of the row switches and each super pixel column including one of the column switches.

\* \* \* \* \*